(12) United States Patent
Mori et al.

(10) Patent No.: US 9,761,600 B2
(45) Date of Patent: Sep. 12, 2017

(54) SEMICONDUCTOR MEMORY DEVICE

(71) Applicant: Kabushiki Kaisha Toshiba, Minato-ku (JP)

(72) Inventors: Mikiko Mori, Kuwana (JP); Ryota Suzuki, Yokkaichi (JP); Tatsuya Kato, Yokkaichi (JP); Wataru Sakamoto, Yokkaichi (JP); Fumie Kikushima, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/269,061

(22) Filed: Sep. 19, 2016

(65) Prior Publication Data
US 2017/0005107 A1    Jan. 5, 2017

Related U.S. Application Data

(63) Continuation of application No. 14/644,542, filed on Mar. 11, 2015.

(60) Provisional application No. 62/049,104, filed on Sep. 11, 2014.

(51) Int. Cl.
| H01L 21/336 | (2006.01) |
|---|---|
| H01L 27/11556 | (2017.01) |
| H01L 27/11524 | (2017.01) |
| H01L 27/11529 | (2017.01) |

(52) U.S. Cl.
CPC .. *H01L 27/11556* (2013.01); *H01L 27/11524* (2013.01); *H01L 27/11529* (2013.01)

(58) Field of Classification Search
None
See application file for complete search history.

(56) References Cited

U.S. PATENT DOCUMENTS

| 5,990,509 | A | 11/1999 | Burns, Jr. | |
|---|---|---|---|---|
| 7,898,854 | B2 | 3/2011 | Kutsukake | |
| 8,008,732 | B2 | 8/2011 | Kiyotoshi et al. | |
| 8,644,046 | B2 | 2/2014 | Seol et al. | |
| 9,406,801 | B2 * | 8/2016 | Toh | H01L 29/66795 |
| 2015/0200199 | A1 | 7/2015 | Sakamoto et al. | |
| 2015/0279975 | A1 * | 10/2015 | Hsiao | H01L 29/66818 257/401 |
| 2016/0336315 | A1 * | 11/2016 | You | H01L 27/0886 |
| 2016/0358856 | A1 * | 12/2016 | Kim | H01L 29/7848 |

* cited by examiner

*Primary Examiner* — Thao P Le
(74) *Attorney, Agent, or Firm* — Oblon, McClelland, Maier & Neustadt, L.L.P.

(57) ABSTRACT

A semiconductor device according to an embodiment includes two semiconductor pillars, a connection member connected between the two semiconductor pillars, and a contact connected to the connection member. There is not a conductive member disposed between the two semiconductor pillars.

17 Claims, 20 Drawing Sheets

SEMICONDUCTOR MEMORY DEVICE

CROSS-REFERENCE TO RELATED APPLICATIONS

This application is a continuation of and claims the benefit of priority under 35 U.S.C. §120 from U.S. Ser. No. 14/644,542 filed Mar. 11, 2015, and claims the benefit of priority from U.S. Provisional Patent Application 62/049,104 filed Sep. 11, 2014; the entire contents of each of which are incorporated herein by reference.

FIELD

Embodiments described herein relate generally to a semiconductor memory device.

BACKGROUND

The bit cost of NAND-type flash memories has been reduced through the shrink of the planar structure and multi-valued memory cells. However, the shrink of the planar structure is approaching its limit due to the limit of processing technology and an increase in the cost of lithography apparatuses. Recently, therefore, technology to stack memory cells in the vertical direction has been proposed.

DETAILED DESCRIPTION

A semiconductor memory device according to an embodiment includes a first semiconductor pillar extending in a first direction, a second semiconductor pillar extending in the first direction. The first semiconductor pillar and the second semiconductor pillar are arranged in a second direction intersecting the first direction. The device includes two first electrode films extending in a third direction intersecting both of the first direction and the second direction. The two first electrode films are disposed on both outsides of a pair of the first semiconductor pillar and the second semiconductor pillar in the second direction. The device includes two second electrode films provided between the first semiconductor pillar and one of the first electrode films and between the second semiconductor pillar and another of the first electrode films. The device includes a first insulating film provided between the first semiconductor pillar and one of the second electrode films, a second insulating film provided between the one of the second electrode films and the one of the first electrode films. The device includes a first connection member being connected in common to an upper end of the first semiconductor pillar and an upper end of the second semiconductor pillar. The device includes a first contact. A lower end of the first contact is connected to the first connection member. The device includes a first upper interconnect extending in the second direction and connected to an upper end of the first contact.

(Embodiment)

Hereinafter, an embodiment of the invention will be described with reference to the drawings.

Figure 1:
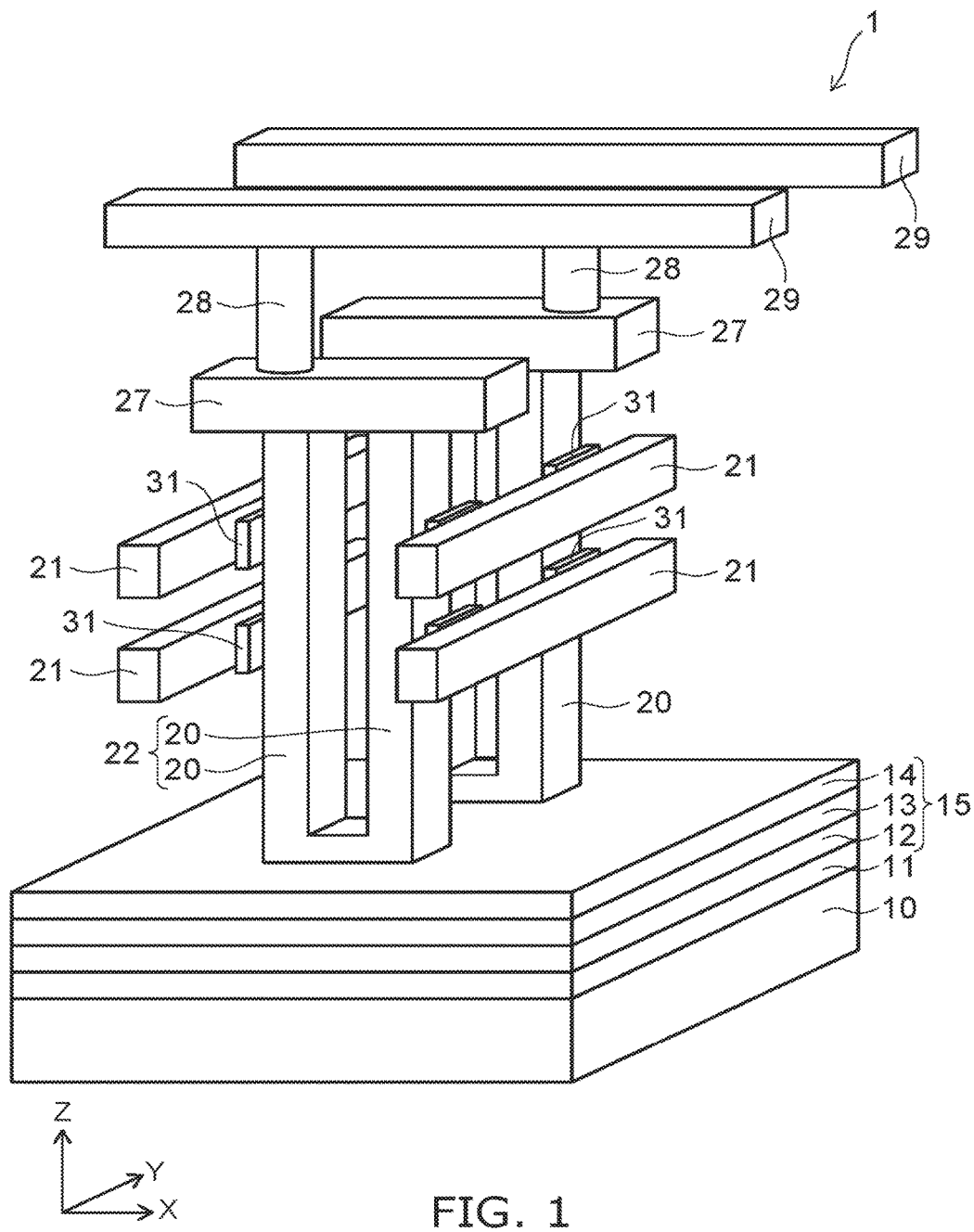
FIG. 1 is a perspective view illustrating a semiconductor memory device according to an embodiment.

FIG. 1 is a perspective view illustrating a semiconductor memory device according to the embodiment.

Figure 2A:
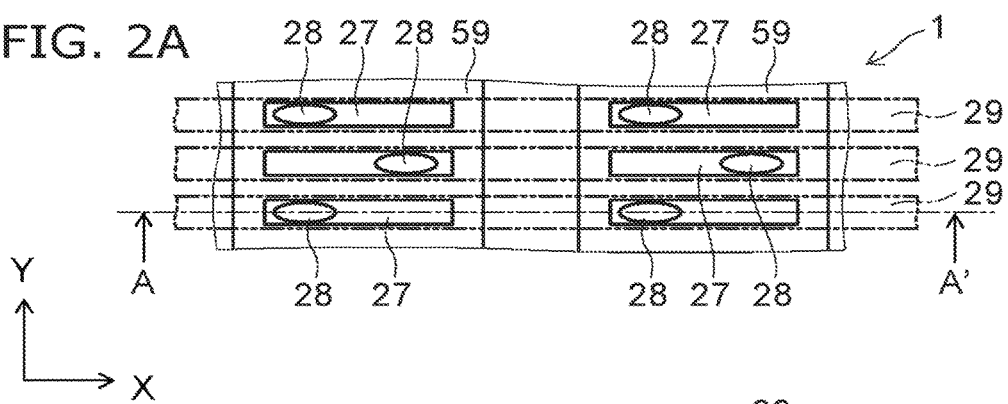
FIG. 2A is a plan view illustrating the semiconductor memory device according to the embodiment.
Figure 2B:
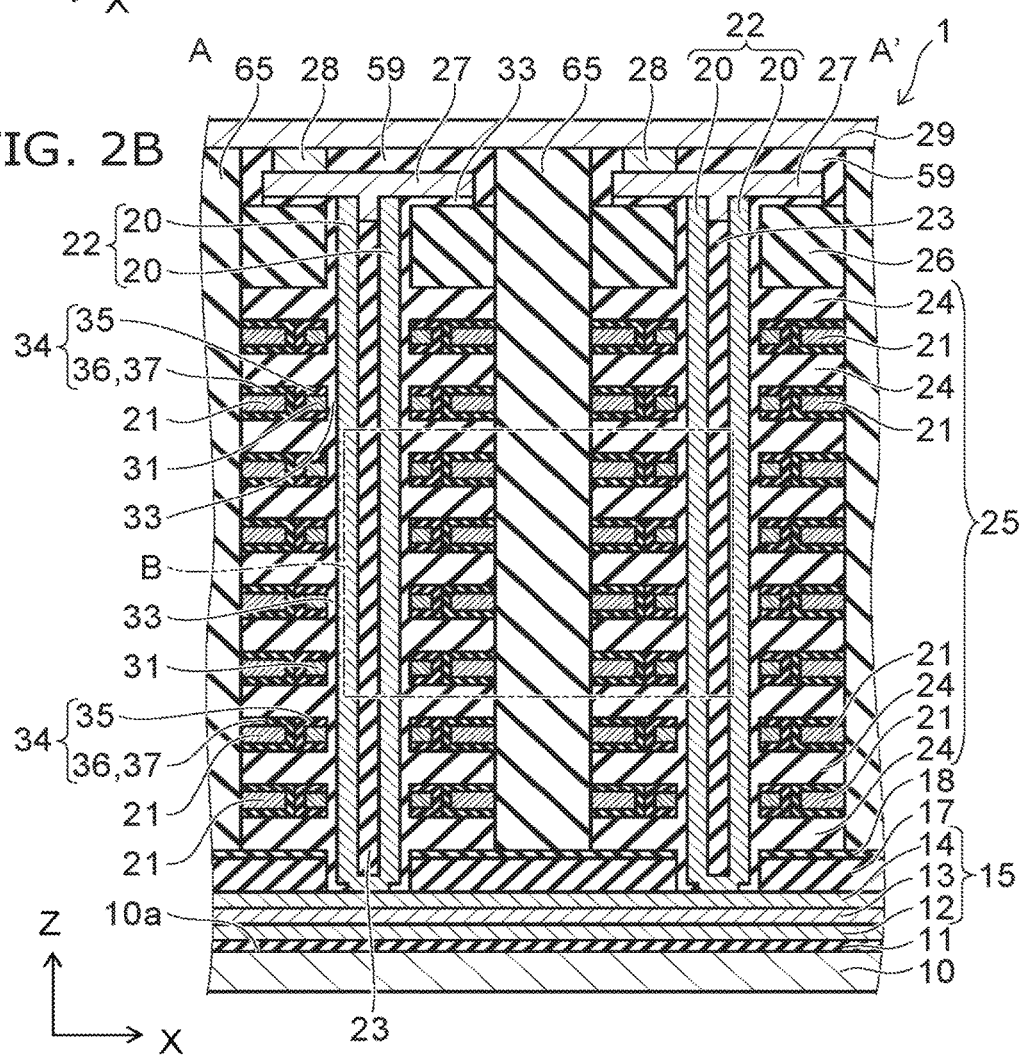
FIG. 2B is a cross-sectional view taken along the line A-A' shown in FIG. 2A.

FIG. 2A is a plan view illustrating the semiconductor memory device according to the embodiment; and FIG. 2B is a cross-sectional view taken along the line A-A' shown in FIG. 2A.

Figure 3:
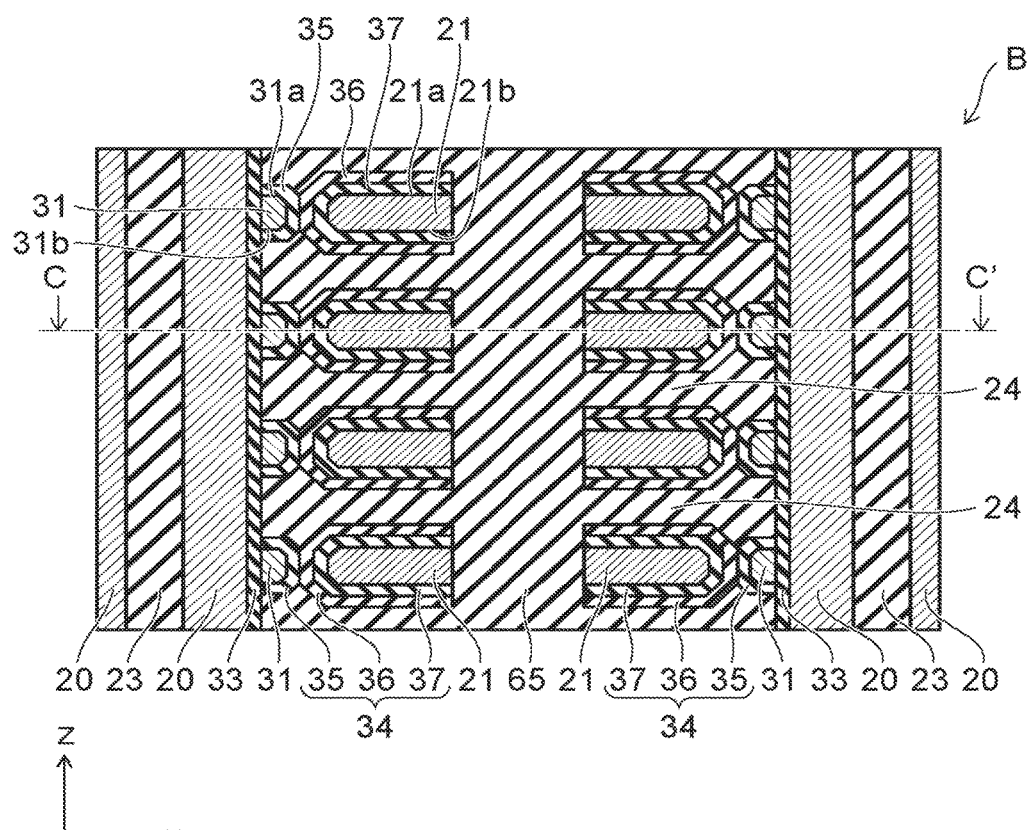
FIG. 3 is a cross-sectional view showing a region B in FIG. 2B.

FIG. 3 is a cross-sectional view showing a region B in FIG. 2B.

Figure 4:
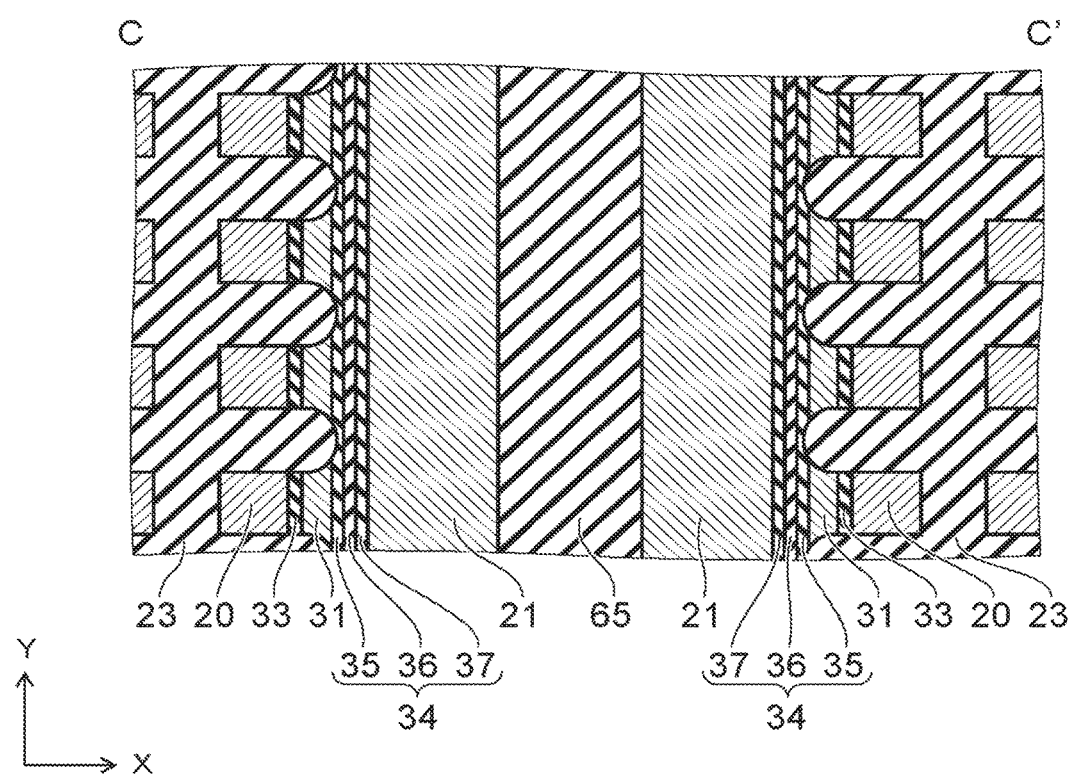
FIG. 4 is a cross-sectional view taken along the line C-C' shown in FIG. 3.

FIG. 4 is a cross-sectional view taken along the line C-C' shown in FIG. 3.

In FIG. 1, only some members are selectively shown for convenience of illustration.

As shown in FIGS. 1, 2A, and 2B, a silicon substrate 10 is provided in the semiconductor memory device 1 according to the embodiment. Hereinafter, for convenience of description, an XYZ orthogonal coordinate system is adopted in the specification. Two directions parallel to an upper surface 10a of the silicon substrate and orthogonal to each other are defined as an "X-direction" and a "Y-direction", and a direction vertical to the upper surface 10a is defined as a "Z-direction".

An insulating film 11 made of, for example, silicon oxide, a conductive layer 12 made of, for example, polysilicon, an interconnect layer 13 made of, for example, tungsten, and a conductive layer 14 made of, for example, polysilicon are stacked in this order on the silicon substrate 10. A cell source line 15 is formed of the conductive layer 12, the interconnect layer 13, and the conductive layer 14. The shape of the cell source line 15 is plate-like extending in an XY-plane.

An insulating film 17 made of, for example, silicon oxide is provided on the cell source line 15. A stopper film 18 made of, for example, silicon nitride is provided on the insulating film 17.

A plurality of silicon pillars 20 extending in the Z-direction are provided on the cell source line 15. The silicon pillar 20 is made of, for example, polysilicon. A lower end of the silicon pillar penetrates the stopper film 18 and the insulating film 17, and is connected to the cell source line 15. As viewed from the Z-direction, the silicon pillars 20 are arranged in a matrix along the X-direction and the Y-direction, and connected in common to the cell source line 15.

A plurality of control gate electrode films 21 made of, for example, tungsten are provided on the X-direction side as viewed from the silicon pillar 20. The control gate electrode films 21 are arranged spaced from each other in a matrix along the X-direction and the Z-direction, and extend in the Y-direction.

In the X-direction, two silicon pillars 20 and two control gate electrode films 21 are alternately arranged. In other words, when the silicon pillars 20 arranged in the X-direction are divided into a plurality of sets 22 of two adjacent silicon pillars 20 each, and two control gate electrode films 21 are arranged so as to be located between the sets 22, the control gate electrode films 21 pass between the sets 22 and extend in the Y-direction, but the control gate electrode film 21 is not disposed between the two silicon pillars 20 belonging to each of the sets 22. Moreover, the control gate electrode film 21 is not disposed between the silicon pillars 20 arranged along the Y-direction. The lower ends of the two silicon pillars 20 belonging to each of the sets 22 are integrated together.

An inter-layer insulating film 23 is provided between the silicon pillars 20. Moreover, an inter-layer insulating film 24 made of, for example, silicon oxide is provided between the control gate electrode films 21, below the control gate electrode film 21 in the lowermost layer, and above the control gate electrode film 21 in the uppermost layer. Each of stacked bodies 25 is formed of the plurality of sets 22 arranged in a column along the Y-direction, the inter-layer insulating film 23, the control gate electrode films 21 in two columns disposed on both sides of the sets 22 in the X-direction and arranged along the Z-direction, and the inter-layer insulating film 24 disposed between these control gate electrode films 21. The stacked bodies 25 are arranged spaced from each other along the X-direction.

A hard mask 26 is provided on the stacked body 25. The silicon pillars 20 and the inter-layer insulating film 23 are extracted to the position of an upper surface of the hard mask 26. A bridge-like connection member 27 whose longitudinal direction is the X-direction is provided on the two silicon pillars 20 belonging to the set 22. Due to this, upper ends of the two silicon pillars 20 belonging to the set 22 are respectively connected to both end portions of the connection member 27 in the longitudinal direction (the X-direction).

A contact 28 for bit line is provided on the connection member 27. Moreover, a hard mask 59 is provided on the hard mask 26 so as to embed the connection member 27 and the contact 28. An inter-layer insulating film 65 extending in an YZ-plane is provided between structures each including the stacked body 25, the hard mask 26, the connection members 27, the contacts 28, and the hard mask 59.

A plurality of bit lines 29 are provided on the hard mask 59. The bit line 29 passes through regions directly on the contacts 28 and extends in the X-direction. Due to this, the bit line 29 is connected to the silicon pillars 20 via the contact 28 and the connection member 27. As viewed from the Z-direction, the contacts 28 are arranged in a staggered manner. That is, the contacts 28 connected to the bit lines 29 adjacent to each other in the Y-direction are different in position from each other in the X-direction.

As described above, each of the silicon pillars 20 is connected between the bit line 29 and the cell source line 15. That is, the semiconductor memory device 1 is an I-shaped pillar-type stacked memory device.

As shown in FIGS. 3 and 4, a floating gate electrode film 31 made of, for example, polysilicon is provided between the silicon pillar 20 and the control gate electrode film 21. The floating gate electrode film 31 is provided at each of intersections between the silicon pillars 20 and the control gate electrode films 21. Therefore, the floating gate electrode films 31 are arranged spaced from each other in a three-dimensional matrix along the X-direction, the Y-direction, and the Z-direction. Moreover, as viewed from the Z-direction, the shape of the floating gate electrode film 31 is fan-like with a portion thereof on the control gate electrode film 21 side widened.

A tunnel insulating film 33 made of, for example, silicon oxide is provided between the silicon pillar 20 and the floating gate electrode film 31. The tunnel insulating film 33 is provided on each of the silicon pillars 20, and the shape thereof is strip-like extending in the Z-direction with the X-direction as the thickness direction and the Y-direction as the width direction.

On the other hand, a block insulating film 34 is provided between the floating gate electrode film 31 and the control gate electrode film 21. The block insulating film 34 is, for example, a three-layer film of a silicon nitride layer 35, a silicon oxide layer 36, and a silicon nitride layer 37 stacked in this order from the floating gate electrode film 31 side toward the control gate electrode film 21 side. The silicon nitride layer 35 is formed so as to surround the floating gate electrode film 31, and covers an upper surface 31a and a lower surface 31b of the floating gate electrode film 31. The silicon oxide layer 36 and the silicon nitride layer 37 are formed so as to surround the control gate electrode film 21, and cover an upper surface 21a and a lower surface 21b of the control gate electrode film 21. For convenience of illustration, the silicon oxide layer 36 and the silicon nitride layer 37 are shown as a single insulating layer in FIG. 2B. The same applies to FIGS. 17, 18, 20A, and 20B described later.

The tunnel insulating film 33 is a film that is usually insulative and allows a tunnel current to flow therethrough when a voltage within the range of drive voltage of the semiconductor memory device 1 is applied. The block insulating film 34 is a film that does not allow a current to substantially flow therethrough even when a voltage within the range of drive voltage of the semiconductor memory device 1 is applied. The equivalent oxide thickness (EOT) of the tunnel insulating film 33 is greater than that of the block insulating film 34, and the permittivity of the tunnel insulating film 33 is lower than that of the block insulating film.

In this manner, a memory cell transistor including the tunnel insulating film 33, the floating gate electrode film 31, and the block insulating film 34 is configured at each of the intersections between the silicon pillars 20 and the control gate electrode films 21. The memory cell transistors are arranged in a three-dimensional matrix along the X-direction, the Y-direction, and the Z-direction. The memory cell transistor is a transistor in which charge is stored into the floating gate electrode film 31 to change the threshold and therefore data can be stored.

Moreover, in the memory cell transistors on a plurality of stages arranged along the Z-direction, memory cell transistors on one to several stages from the top, for example, on two stages from the top are used as upper selection transistors, while memory cell transistors on one to several stages from the bottom, for example, on two stages from the bottom are used as lower selection transistors. The upper selection transistor is used not to store data, but to select whether or not the connection member 27 is connected to the silicon pillar 20. Similarly, the lower selection transistor is used to select whether or not the cell source line 15 is connected to the silicon pillar 20. Two control gate electrode films 21 that configure the upper selection transistors together with the two silicon pillars 20 belonging to the set 22 are extracted to nodes different from each other. Due to this, two upper selection transistors respectively configured of the two silicon pillars 20 belonging to the set 22 can be controlled independently of each other. In other words, potentials different from each other are applied by a peripheral circuit to two control gate electrode films 21 disposed in the uppermost layer of the stacked body 25 and adjacent to each other with the two silicon pillars 20 belonging to the set 22 interposed therebetween.

Next, a method of manufacturing the semiconductor memory device according to the embodiment will be described.

FIGS. 5 to 18 are cross-sectional views illustrating the method of manufacturing the semiconductor memory device according to the embodiment.

Figure 5:
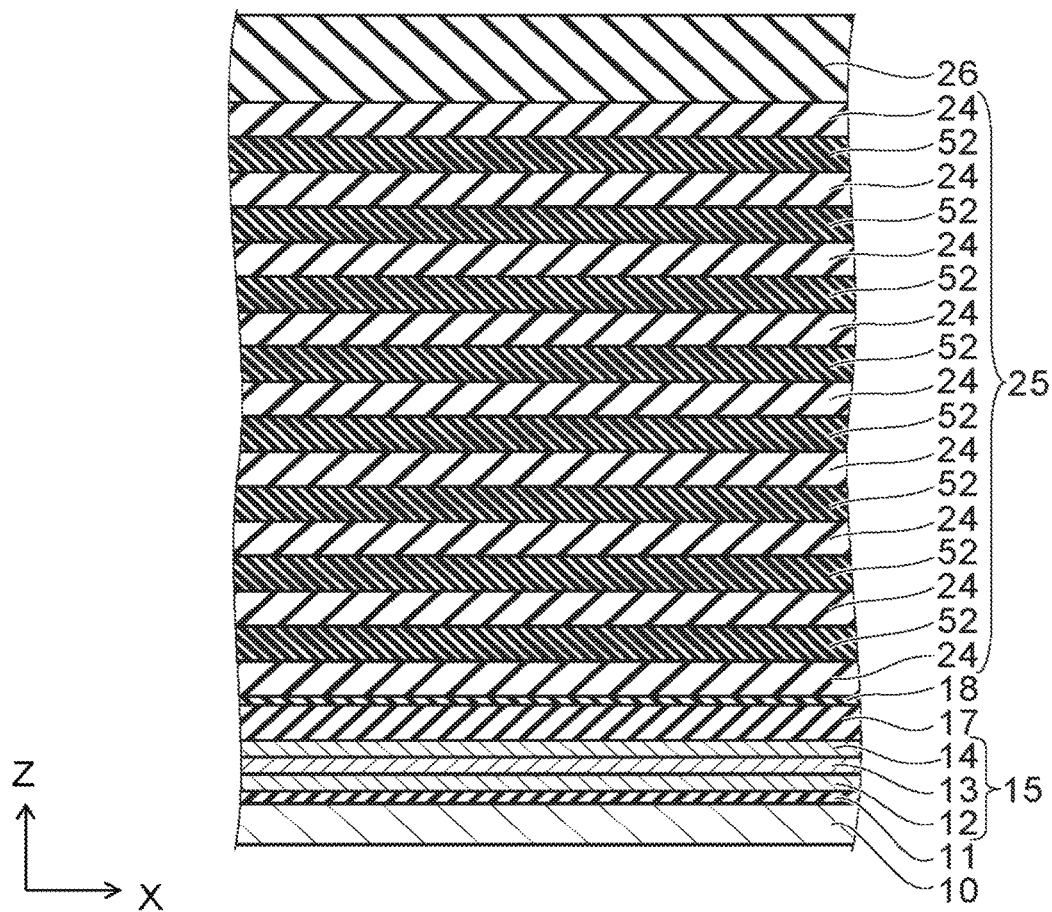
FIGS. 5 to 18 are cross-sectional views illustrating a method of manufacturing the semiconductor memory device according to the embodiment.

First, as shown in FIG. 5, peripheral circuit transistors for driving memory cells are formed in an upper layer portion of the silicon substrate 10 in a peripheral circuit region (not shown).

Next, in both a memory cell region and the peripheral circuit region, the insulating film 11 made of silicon oxide, the conductive layer 12 made of polysilicon, the interconnect layer 13 made of tungsten, and the conductive layer 14 made of polysilicon are formed in this order on the silicon substrate 10, and these layers are patterned in each of blocks by reactive ion etching (RIE). Due to this, the cell source line 15 is formed in each of the blocks. Next, the insulating film 17 made of, for example, silicon oxide is formed on the cell source line 15, and the stopper film 18 made of, for example, silicon nitride is formed on the insulating film 17.

Next, the inter-layer insulating film 24 made of silicon oxide and a silicon nitride film 52 are alternately stacked on the stopper film 18. Due to this, the stacked body 25 is formed. In this case, the film thickness ratio between the inter-layer insulating film 24 and the silicon nitride film 52 is adjusted according to the film thickness of the block insulating film 34 to be embedded from both sides. Next, the hard mask 26 made of, for example, silicon nitride is formed on the stacked body 25.

Figure 6:
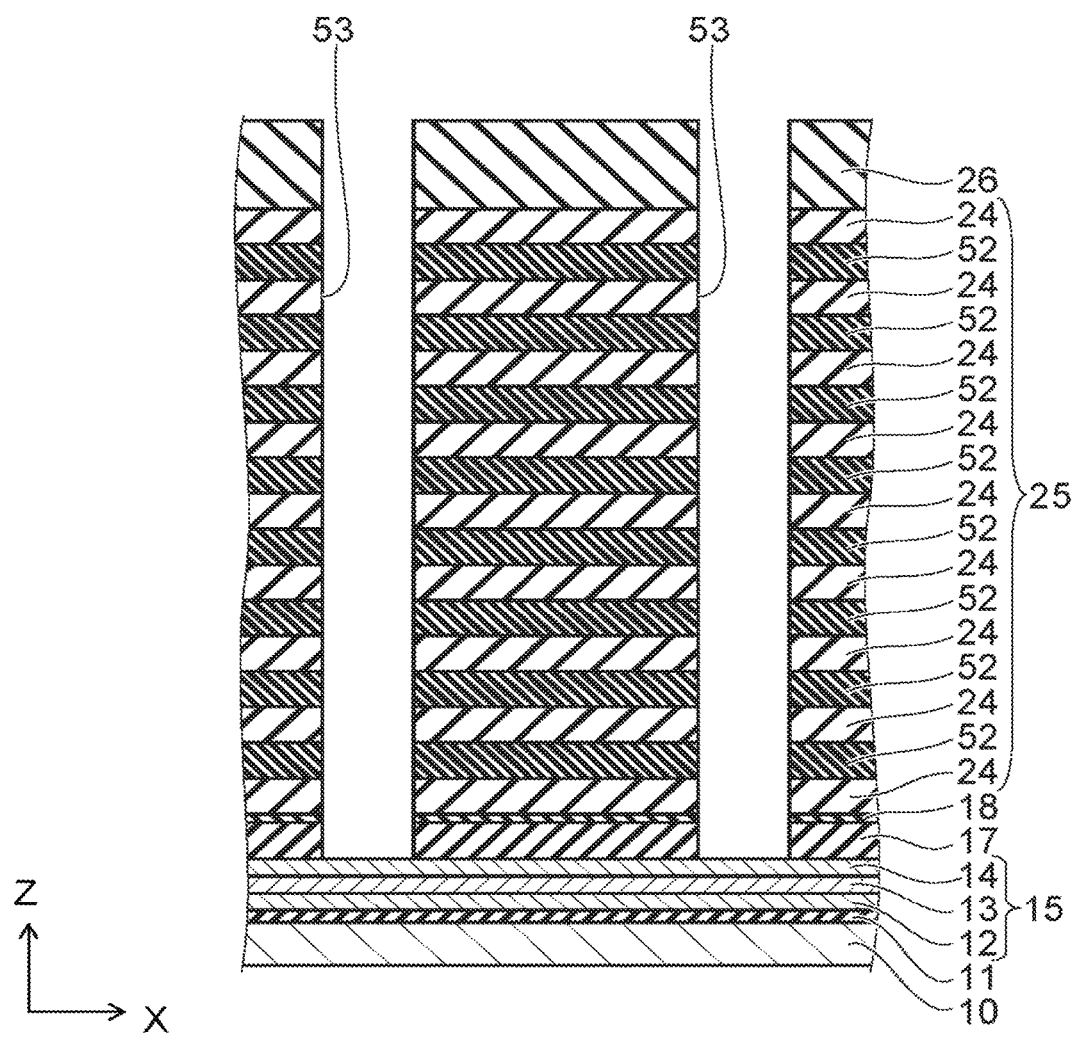

Next, as shown in FIG. 6, the hard mask 26 is patterned into a line-and-space pattern by a lithography method. Next, the stacked body 25 is anisotropically etched by RIE or the like using the patterned hard mask 26 as a mask. Due to this, a plurality of trenches 53 extending in the Y-direction are formed in the stacked body 25. The trench 53 penetrates the stacked body 25.

Figure 7:
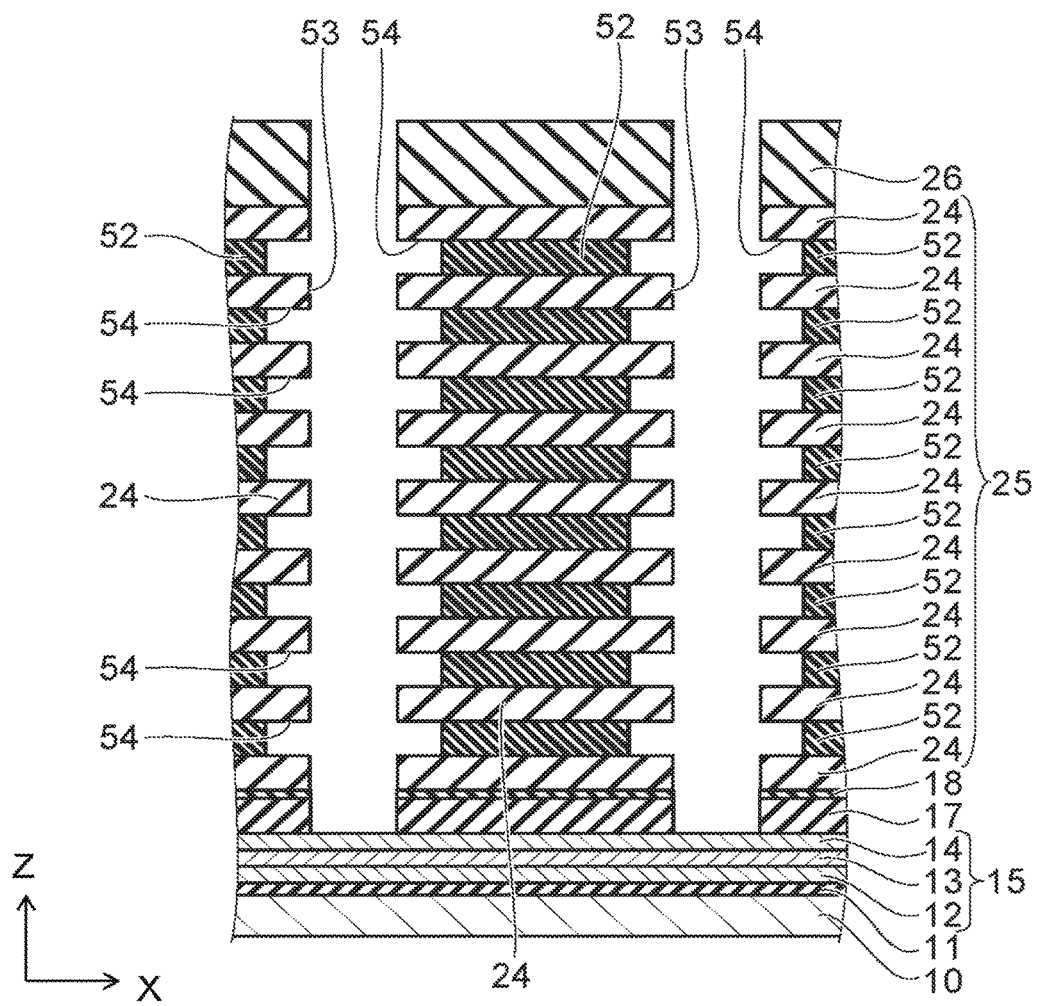

Next, as shown in FIG. 7, the silicon nitride films 52 are recessed by isotropic etching, for example, wet etching through the trenches 53. Due to this, an exposed surface of the silicon nitride film 52 is recessed in an inside surface of the trench 53, so that a recess 54 extending in the Y-direction is formed.

Figure 8:
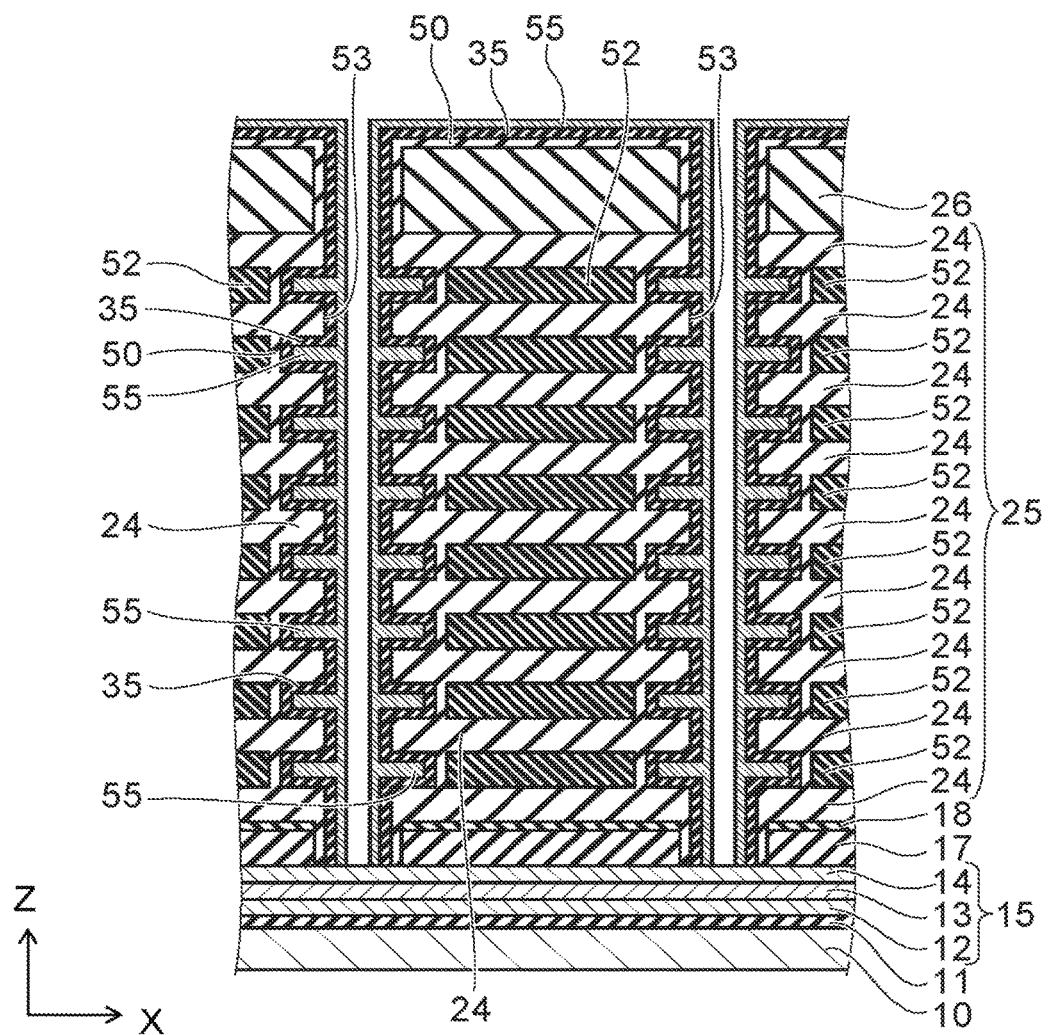

Next, as shown in FIG. 8, a thin silicon oxide layer 50 is formed on an inner surface of the trench 53 by carrying out oxidation treatment. Next, the silicon nitride layer 35 is formed on the entire surface. Next, a polysilicon film 55 is formed on the entire surface. The silicon nitride layer 35 and the polysilicon film 55 are formed on the inside surface of the trench 53, and proceed into the recesses 54.

Figure 9:
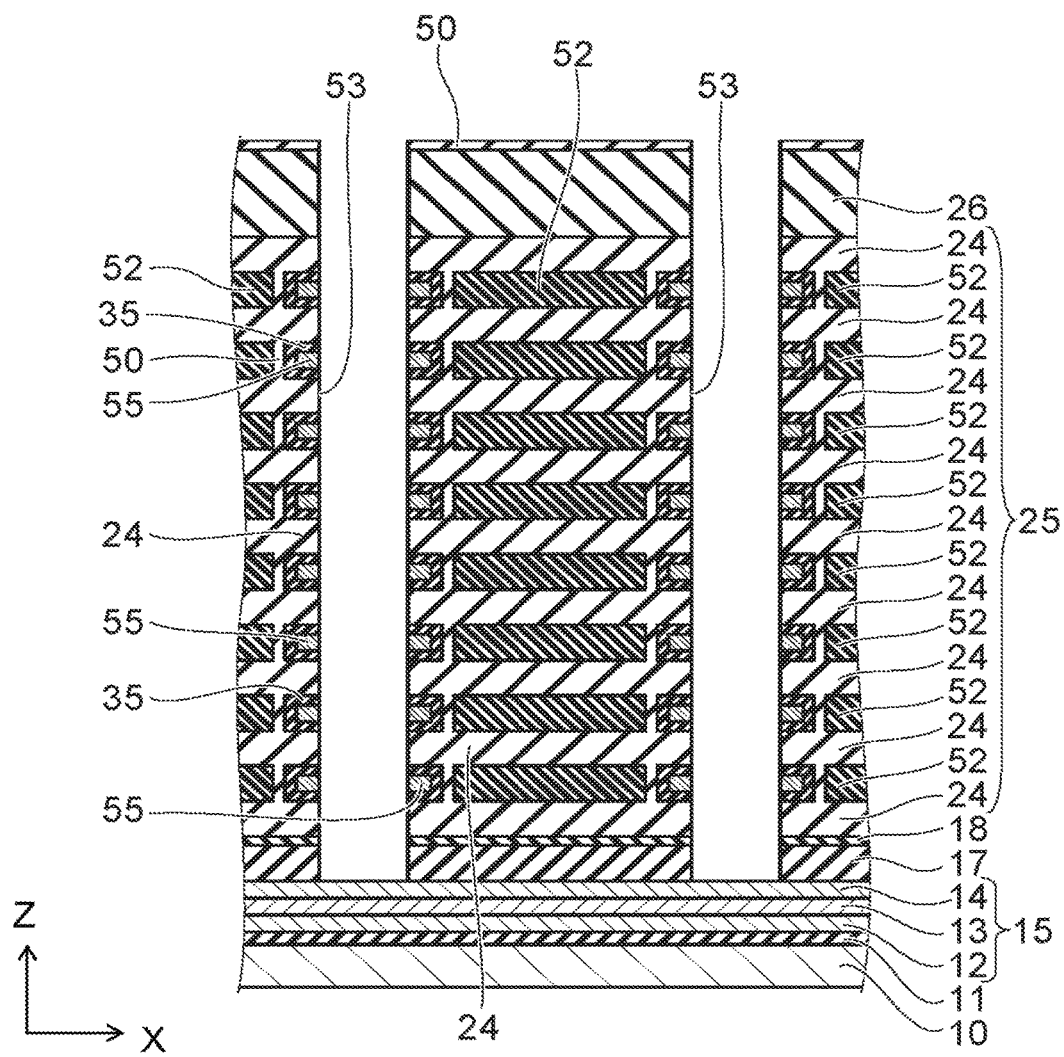

Next, as shown in FIG. 9, the polysilicon film 55 and the silicon nitride layer 35 are selectively removed by anisotropic etching such as RIE along the trench 53, so that the polysilicon film 55 and the silicon nitride layer 35 remain in the recesses 54 while the polysilicon films 55 and the silicon nitride layers 35 remaining in the recesses 54 adjacent in the Z-direction are divided from each other.

Figure 10:
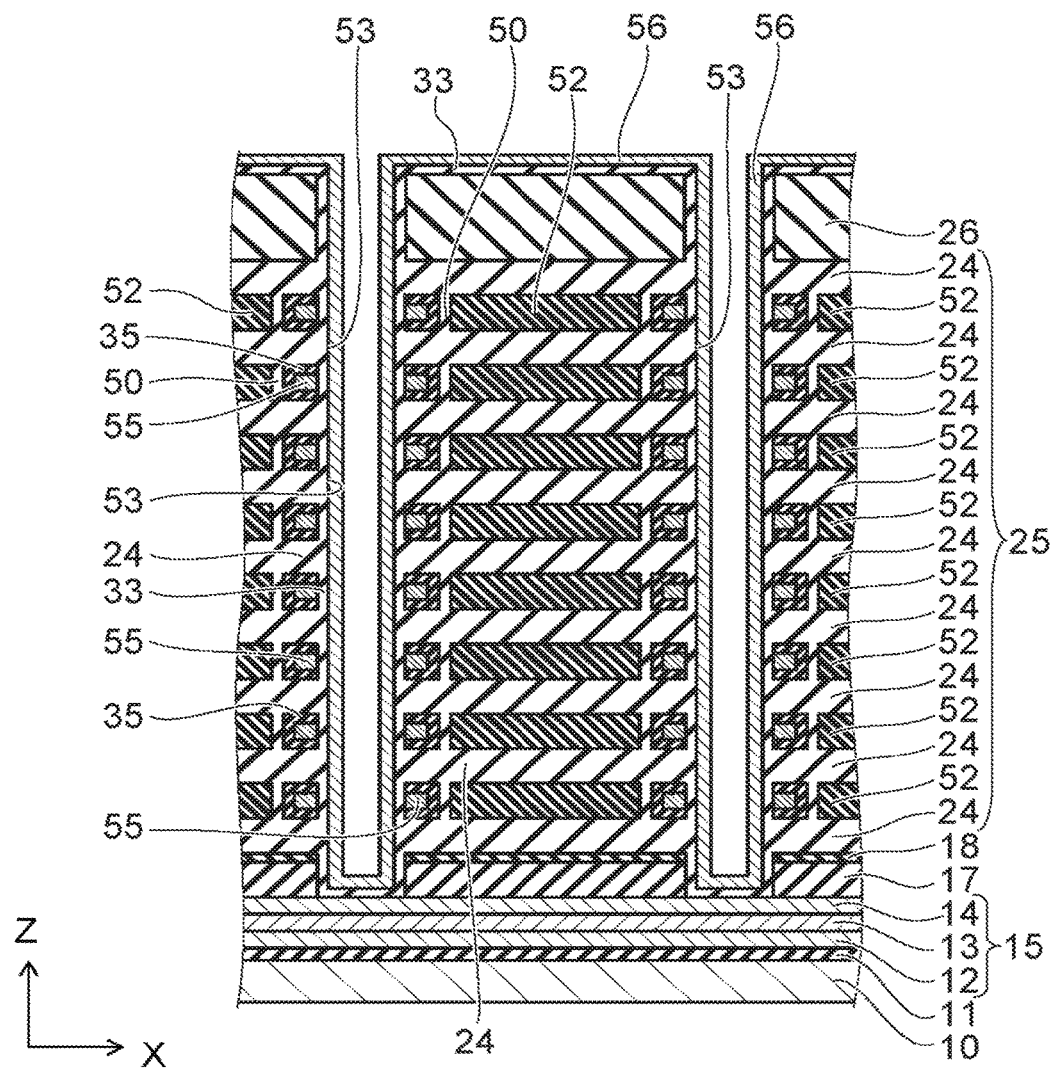

Next, as shown in FIG. 10, the tunnel insulating film 33 and a polysilicon film 56 are deposited in this order.

Figure 11:
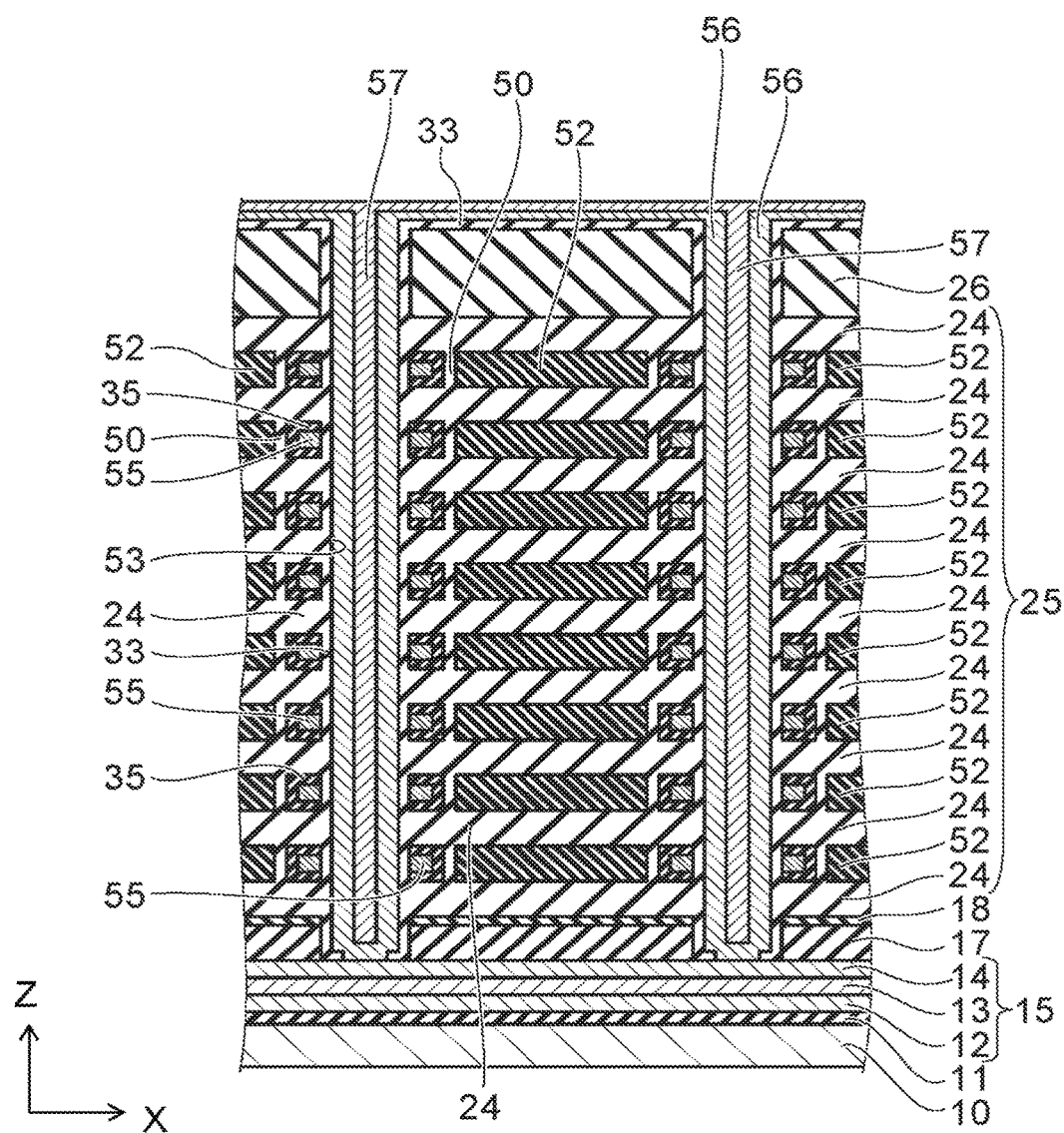

Next, as shown in FIG. 11, portions of the polysilicon film 56 and the tunnel insulating film 33 that are formed on an upper surface of the hard mask 26, and portions of the polysilicon film 56 and the tunnel insulating film 33 that are formed on a bottom surface of the trench 53 are removed by RIE. Due to this, the cell source line 15 is exposed in the bottom surface of the trench 53. Next, the thickness of the polysilicon film 56 is increased by depositing silicon, and the polysilicon film 56 is brought into contact with the cell source line 15. Next, an amorphous silicon member 57 is embedded in the trench 53 by depositing amorphous silicon added with an impurity. Due to this, a space between two polysilicon films 56 facing each other in the trench 53 is filled with the amorphous silicon member 57.

Figure 12:
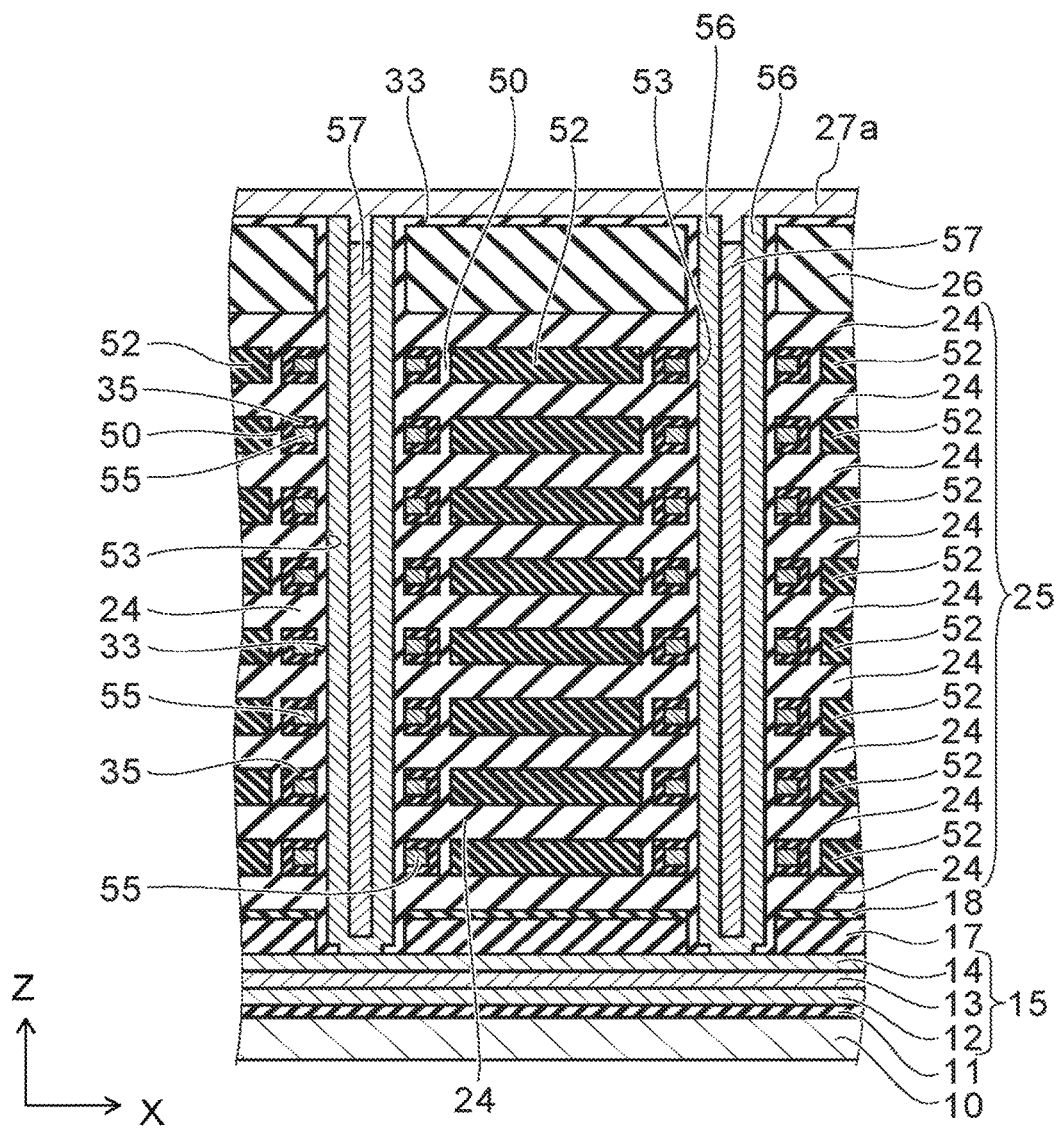

Next, as shown in FIG. 12, the polysilicon film 56 is etched back under such a condition that the amorphous silicon member 57 is preferentially etched, whereby an upper surface of the amorphous silicon member 57 is recessed. Due to this, the upper surface of the amorphous silicon member 57 is located lower than an upper surface of the hard mask 26. Moreover, a portion of the polysilicon film 56 that is formed on the upper surface of the hard mask 26 is also removed, so that the polysilicon film 56 is divided at each of the trenches 53. Next, a polysilicon film 27a is formed on the entire surface.

Figure 13:
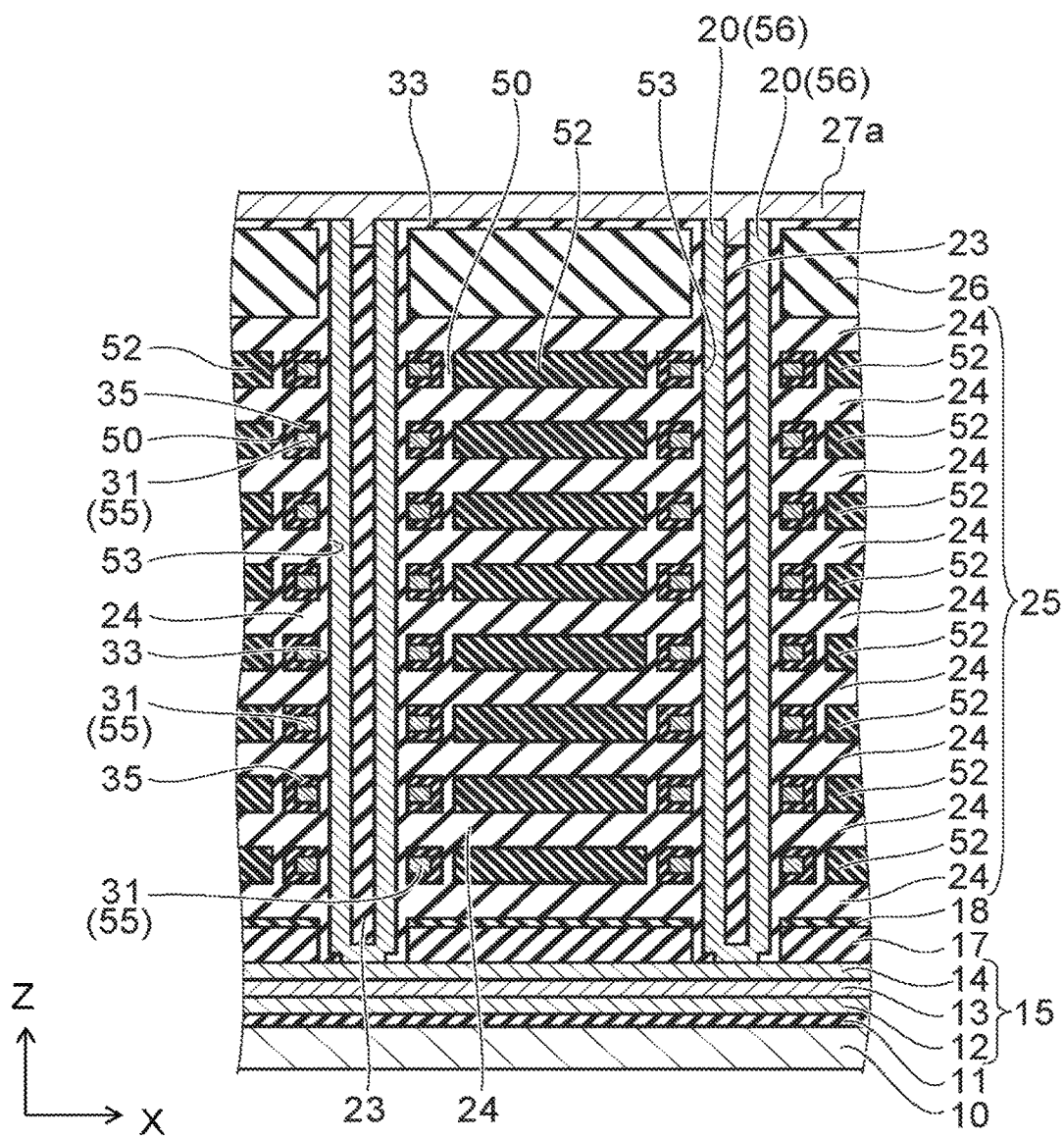

Next, as shown in FIG. 13, RIE is applied using a mask (not shown) in a line-and-space pattern extending in the X-direction. Due to this, the polysilicon film 27a is selectively removed and processed into a line pattern extending in the X-direction. Also, the polysilicon film 55, the tunnel insulating film 33, the polysilicon film 56, and the amorphous silicon member 57 are selectively removed to form holes (not shown) reaching the cell source line 15. The holes are arranged in a matrix along the X-direction and the Y-direction as viewed from the Z-direction. In FIG. 13, the holes are formed on the far side and the near side of the paper. Due to this, the polysilicon film 55 is divided along the Y-direction into the floating gate electrode films 31. Moreover, the polysilicon film 56 is also divided along the Y-direction into the silicon pillars 20.

Next, a remaining portion of the amorphous silicon member 57 is removed by wet etching through the holes (refer to FIG. 12). In FIG. 13, the amorphous silicon member 57 is removed from the far side and the near side of the paper. Next, silicon oxide is deposited to embed the inter-layer insulating film 23 in spaces formed after removing the amorphous silicon member 57 and the holes. In FIG. 13, the amorphous silicon member 57 is removed from the far side and the near side of the paper, and the inter-layer insulating film 23 is embedded.

Figure 14:
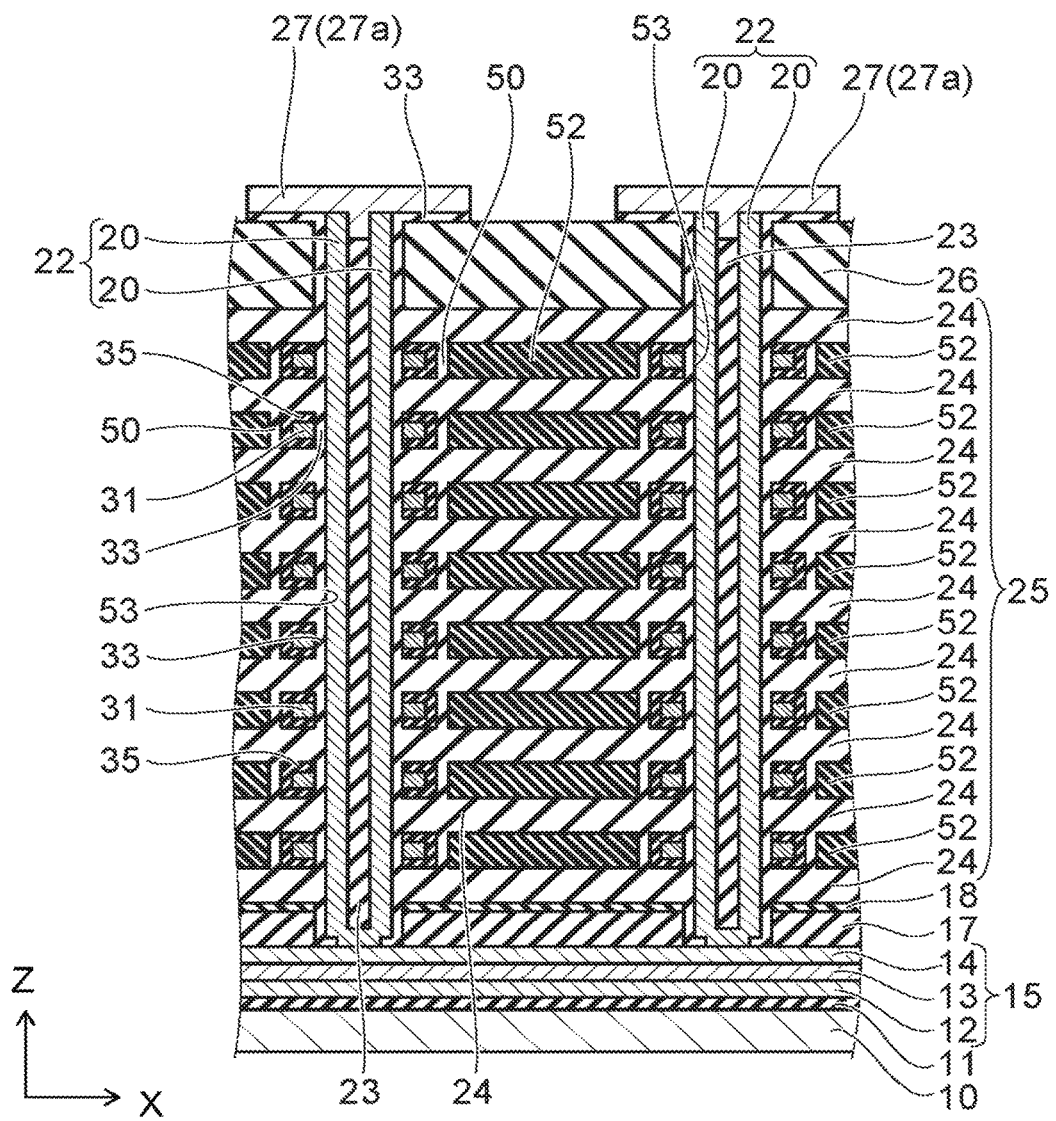

Next, as shown in FIG. 14, the polysilicon film 27a is divided along the X-direction by a lithography method and a RIE method, so that the polysilicon film 27a is cut for every two silicon pillars 20 belonging to the set 22, that is, for every two silicon pillars 20 facing each other in the trench 53. As a result, the polysilicon film 27a is divided along both the X-direction and the Y-direction into a plurality of connection members 27 arranged in a matrix.

Figure 15:
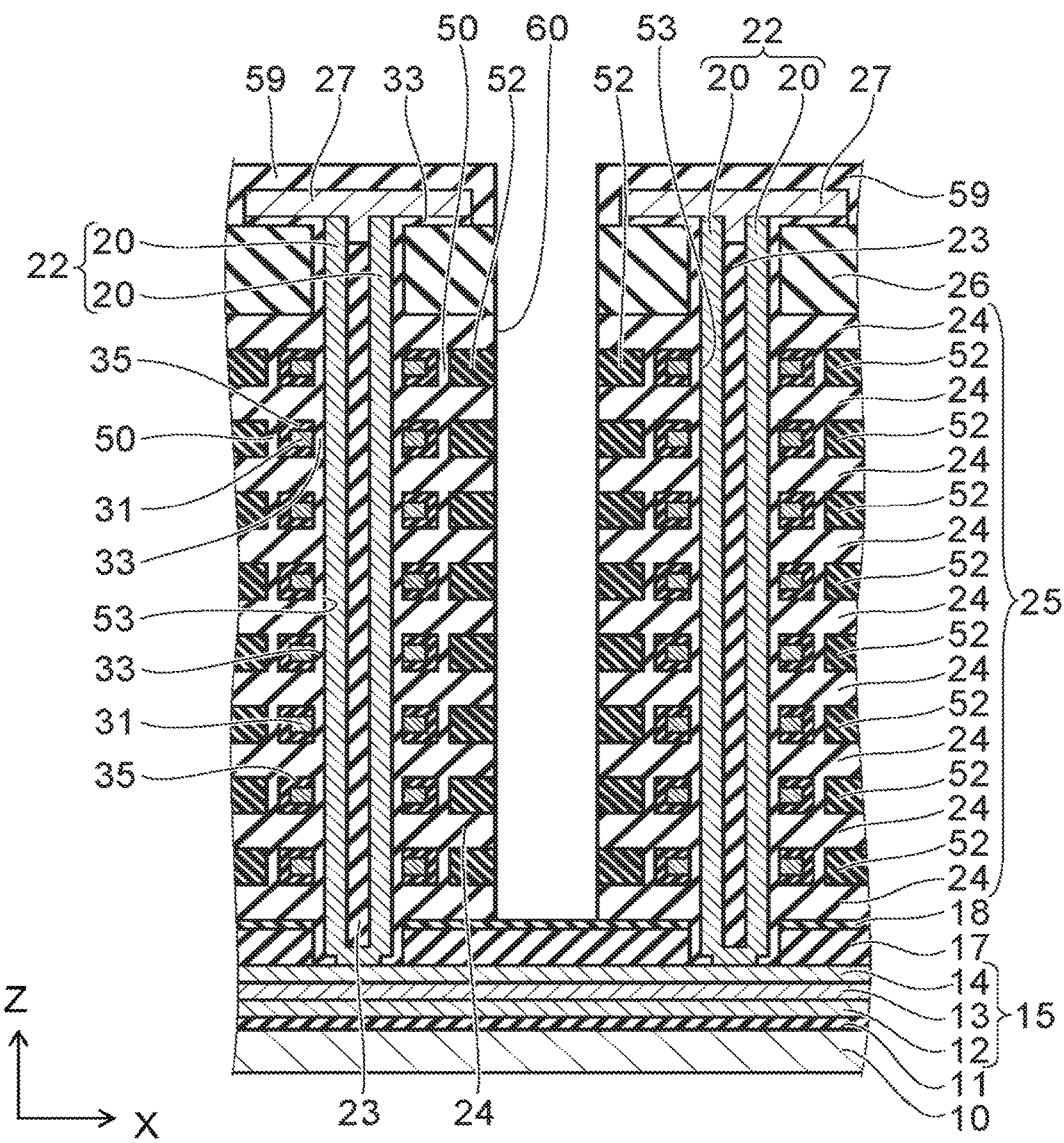

Next, as shown in FIG. 15, the hard mask 59 is formed on the hard mask 26 so as to embed the connection members 27. Next, a mask (not shown) in a line-and-space pattern extending in the Y-direction is formed by a lithography method. Next, with the use of the mask, each of trenches 60 extending in the Y-direction is formed by RIE using the stopper film 18 as a stopper in a portion between the trenches 53 in the stacked body 25, the hard mask 26, and the hard mask 59. Due to this, the trench 53 and the trench 60 are alternately arranged along the X-direction.

Figure 16:
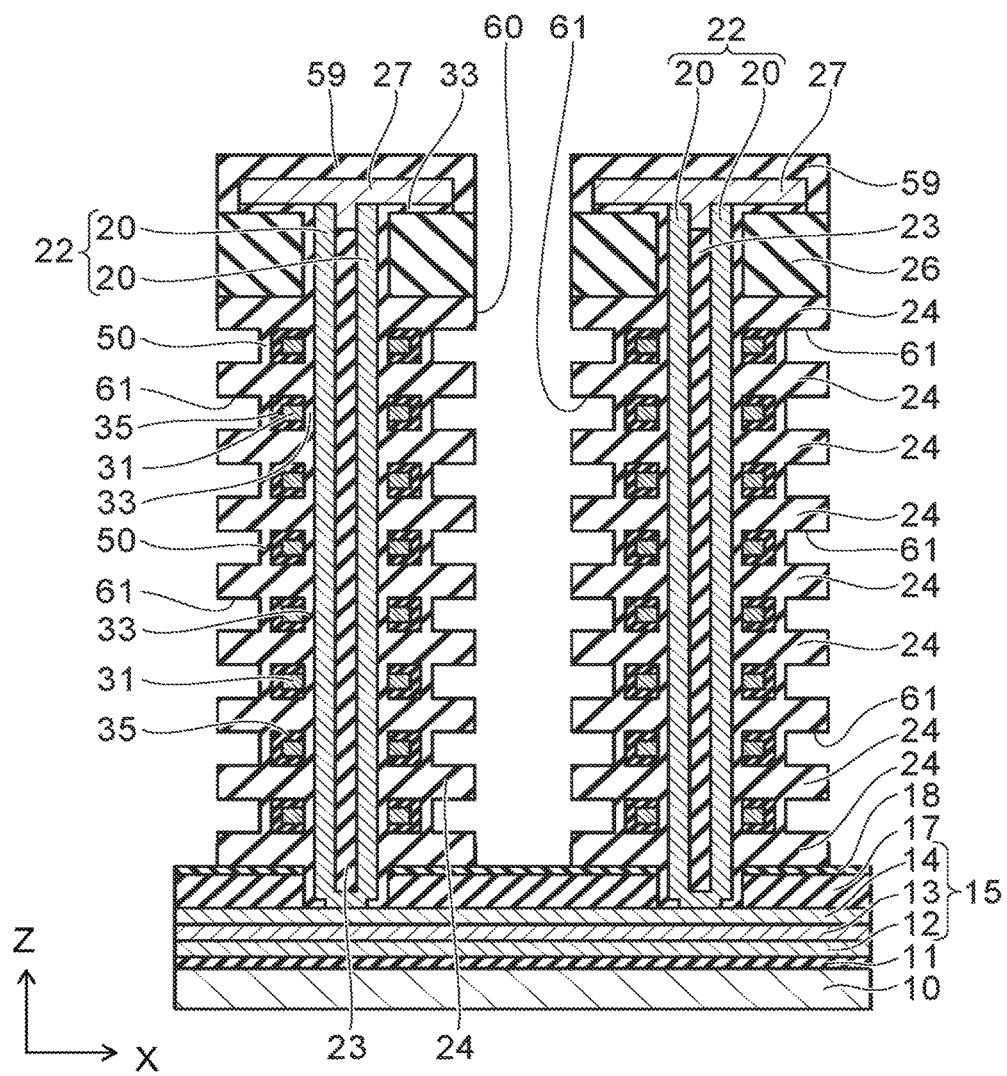

Next, as shown in FIG. 16, the silicon nitride films 52 are removed by wet etching using, for example, hot phosphoric acid through the trench 60. Due to this, recesses 61 extending in the Y-direction are formed in an inside surface of the trench 60. This etching is stopped by the silicon oxide layer 50 exposed in a deep surface of the recess 61. The silicon nitride layer 35 is protected by the silicon oxide layer 50, and therefore is not damaged.

Figure 17:
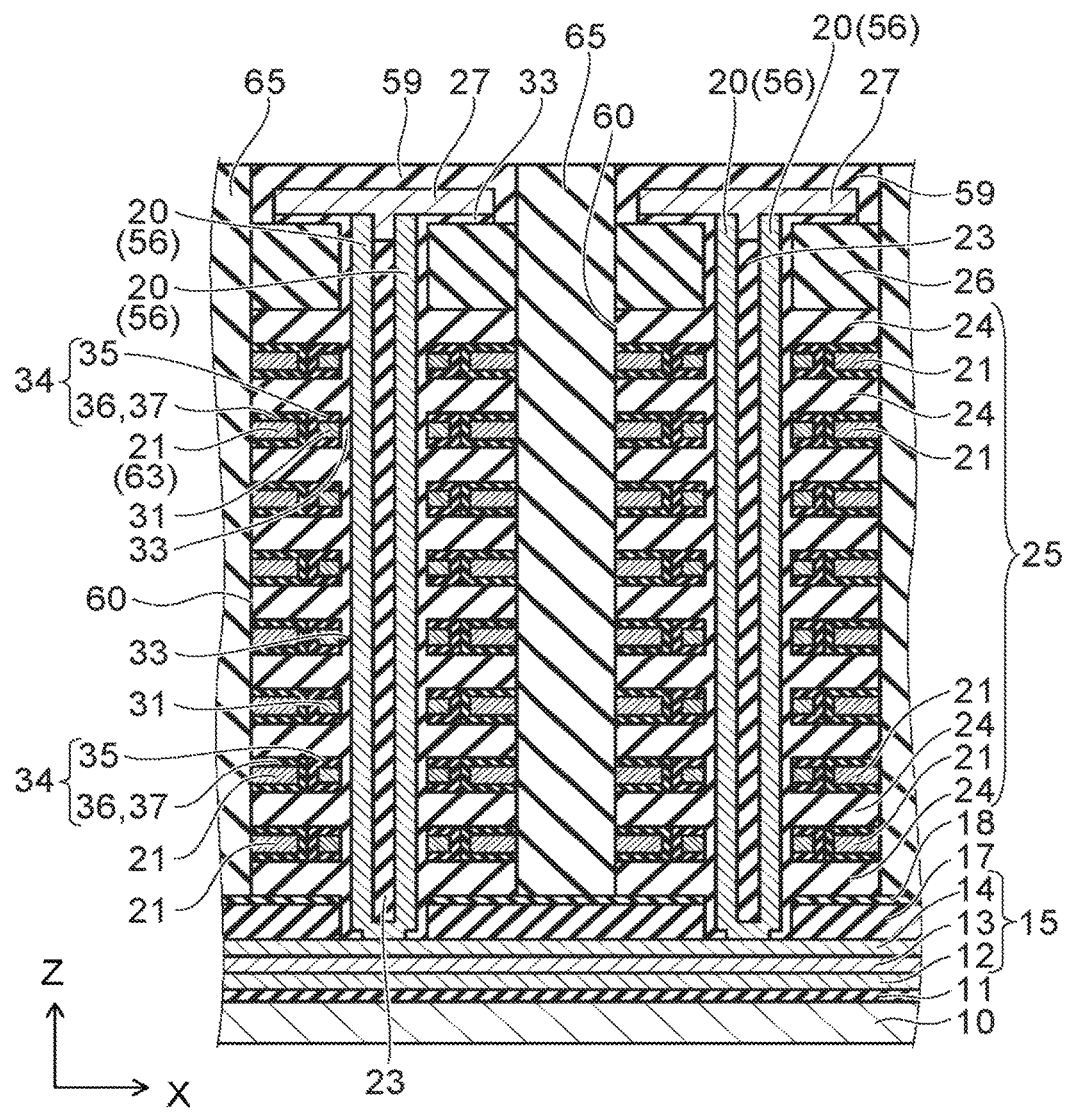

Next, as shown in FIG. 17, the silicon oxide layer 50 (refer to FIG. 16) exposed in the deep surface of the recess 61 is removed. Due to this, the silicon nitride layer 35 is exposed in the deep surface of the recess 61. Next, the silicon oxide layer 36 and the silicon nitride layer 37 are formed on an inner surface of the trench 60. As a result, the block insulating film 34 is formed of the silicon nitride layer 35, the silicon oxide layer 36, and the silicon nitride layer 37 as shown in FIG. 3. As described above, the silicon oxide layer 36 and the silicon nitride layer 37 are shown as a single insulating layer in FIGS. 17 and 18. Next, a tungsten film 63 is deposited on the entire surface by, for example, a chemical vapor deposition (CVD) method. The silicon oxide layer 36, the silicon nitride layer 37, and the tungsten film 63 proceed also into the recesses 61 through the trench 60.

Next, portions of the tungsten film 63, the silicon nitride layer 37, and the silicon oxide layer 36 that are deposited outside the recesses 61 are removed by anisotropic etching such as RIE. Due to this, the tungsten film 63, the silicon nitride layer 37, and the silicon oxide layer 36 remain in the recesses 61, while the tungsten films 63 remaining in the recesses 61 adjacent in the Z-direction are divided from each other. As a result, the control gate electrode film 21 made of the tungsten film 63 is formed in the recess 61. Thereafter, the inter-layer insulating film 65 is embedded in the trench 60, and the upper surface is flattened.

Next, an end of the control gate electrode film 21 is processed into a lead wiring to be connected to a peripheral circuit (not shown). In this case, the control gate electrode films 21 serving as gates of the upper selection transistors, that is, two selection gate electrode films 21 facing each other with the silicon pillars 20 interposed therebetween, in the control gate electrode films 21 on one to several stages in the stacked body 25, are connected to nodes different from each other in the peripheral circuit, so that the two selection gate electrode films 21 can be driven independently of each other.

Figure 18:
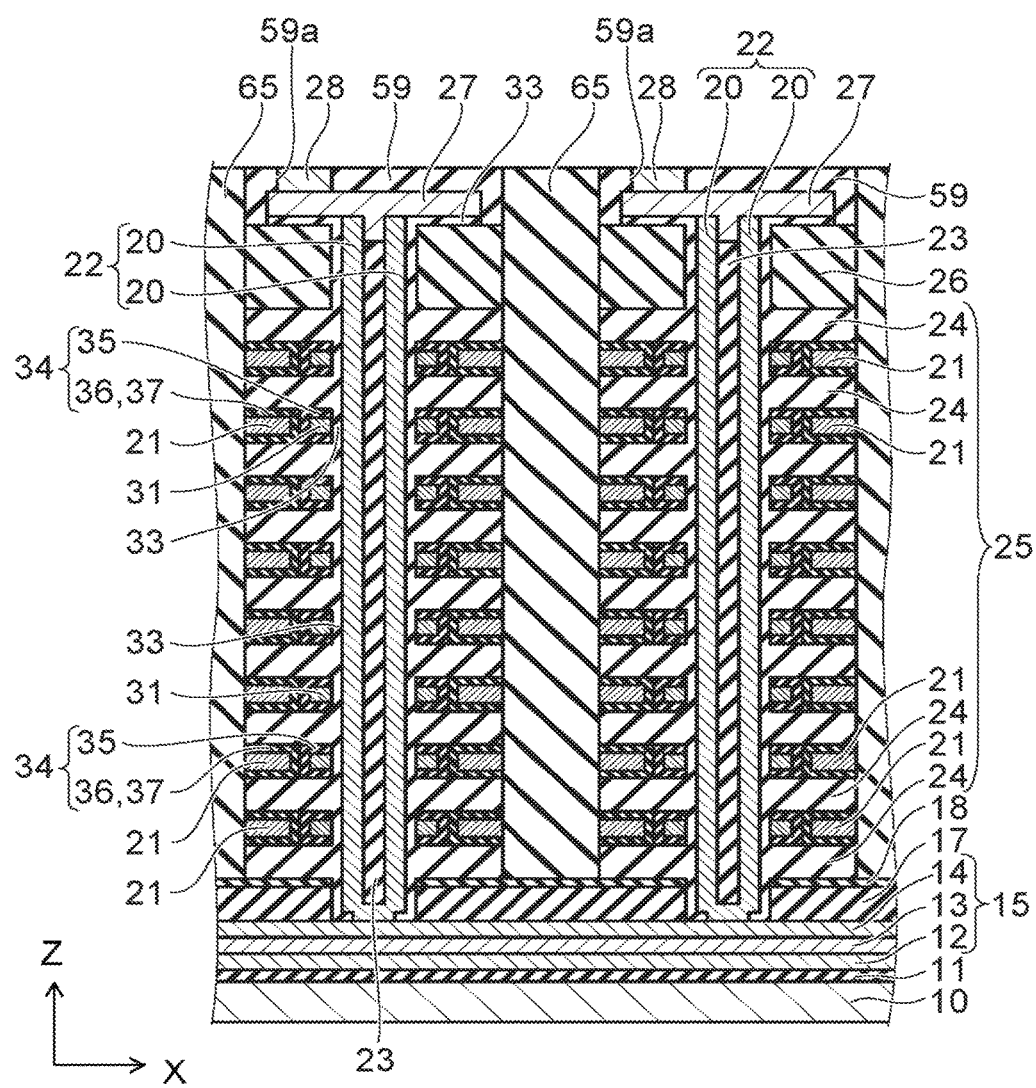

Next, as shown in FIG. 18, the hard mask 59 is selectively removed by a lithography method and a RIE method to form one opening 59a in a region directly on each of the connection members 27. In this case, the position of the opening 59a relative to the connection member 27 is located at one of the both end portions of the connection member 27 in the longitudinal direction (the X-direction). As to the plurality of connection members 27 arranged in the X-direction, the openings 59a are formed on the same side of the connection members 27 in the longitudinal direction. Moreover, as to the plurality of connection members 27 arranged in the Y-direction, the openings 59a are alternately formed on both sides in the longitudinal direction. Due to this, the openings 59a are arranged in a staggered manner as a whole. Next, a metal material such as, for example, tungsten is embedded in the interior of the opening 59a to form the contact 28 for bit line BL.

Next, as shown in FIG. 2A and FIG. 2B, the plurality of bit lines 29 extending in the X-direction are formed so as to be each connected in common to the plurality of contacts 28 arranged along the X-direction. Due to this, the semiconductor memory device 1 according to the embodiment is manufactured.

Next, advantageous effects of the embodiment will be described.

As shown in FIGS. 2A and 2B, one bridge-like connection member 27 is connected in common to the upper end portions of the two silicon pillars 20 belonging to the set 22 in the embodiment. One contact 28 is connected to each of the connection members 27. According to the embodiment as described above, since it is sufficient to provide one contact 28 for every two silicon pillars 20, the arrangement density of the contacts 28 can be reduced.

Especially by arranging the contacts 28 in a staggered manner, an interval between the contacts 28 can be made longer than that between the bit lines 29. Due to this, while keeping the arrangement pitch of the bit lines 29 short and keeping the arrangement density of the memory cells high, the arrangement pitch of the contacts 28 can be increased to increase a lithography margin when forming the openings 59a. In other words, it is possible to reduce the arrangement pitch of the bit lines 29 and increase the density of memory cells while reliably forming the contacts 28. Moreover, since the diameter of the contact 28 can be made large, the resistance of the contact 28 can be reduced.

Moreover, in the semiconductor memory device 1 according to the embodiment, the same bit line potential is applied to two silicon pillars 20 belonging to the same set 22. However, when the two control gate electrode films 21 that respectively configure the upper selection transistors together with these two silicon pillars 20 are extracted to nodes different from each other so that the upper selection transistors can be controlled independently of each other for each of the silicon pillars 20, memory cell transistors that are configured of these two silicon pillars 20 can be used independently of each other for programming and reading data.

(Variation)

Next, a variation of the embodiment described above will be described.

Figure 19:
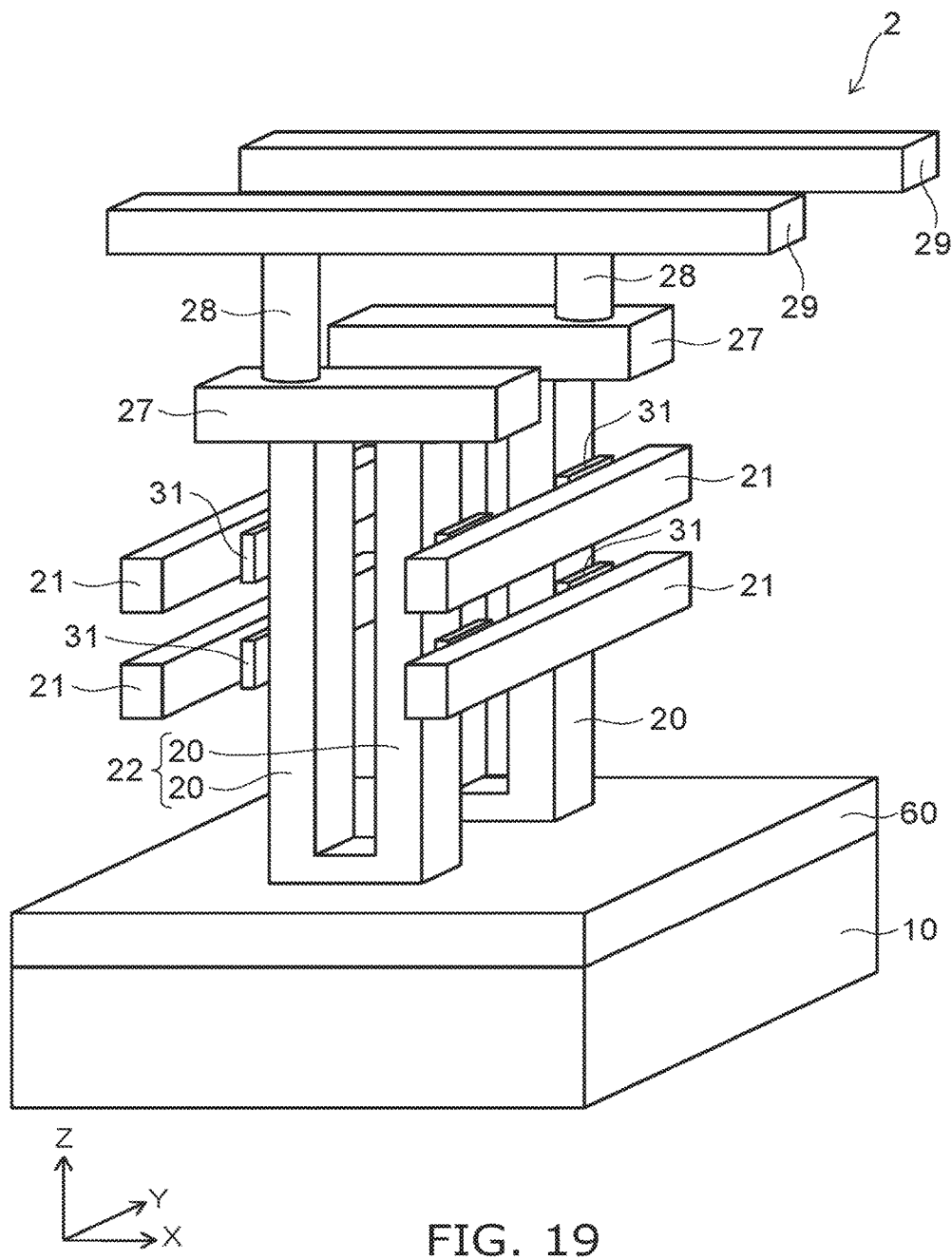
FIG. 19 is a perspective view illustrating a semiconductor memory device according to a variation.

FIG. 19 is a perspective view illustrating a semiconductor memory device according to the variation.

As shown in FIG. 19, the semiconductor memory device 2 according to the variation differs from the semiconductor memory device 1 (refer to FIGS. 1 and 4) according to the embodiment described above in that the cell source line 15 is not provided, and that instead, a p-type well 60 is formed in the upper layer portion of the silicon substrate 10. The lower ends of the silicon pillars 20 are connected to the p-type well 60. The p-type well 60 can be formed by ion injecting an impurity serving as an acceptor into the silicon substrate 10.

Configurations other than those described above, a manufacturing method, and advantageous effects in the variation are the same as those in the embodiment described above.

COMPARATIVE EXAMPLE

Next, a comparative example will be described.

Figure 20A:
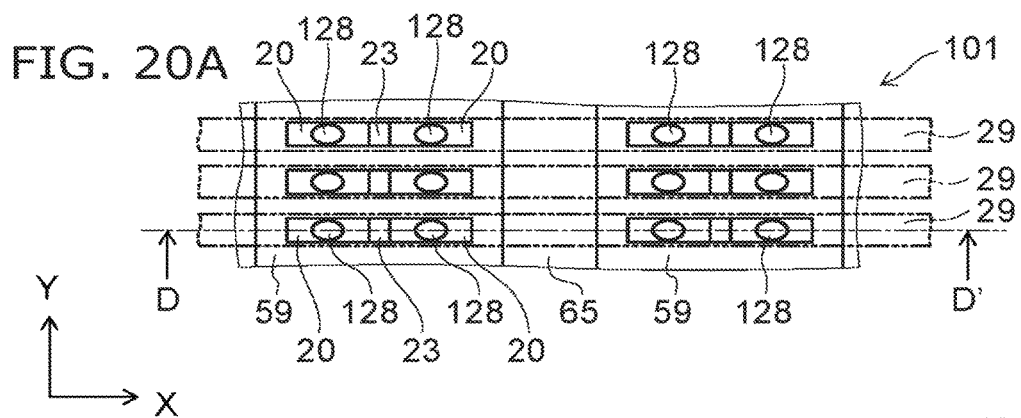
FIG. 20A is a plan view illustrating a semiconductor memory device according to a comparative example.
Figure 20B:
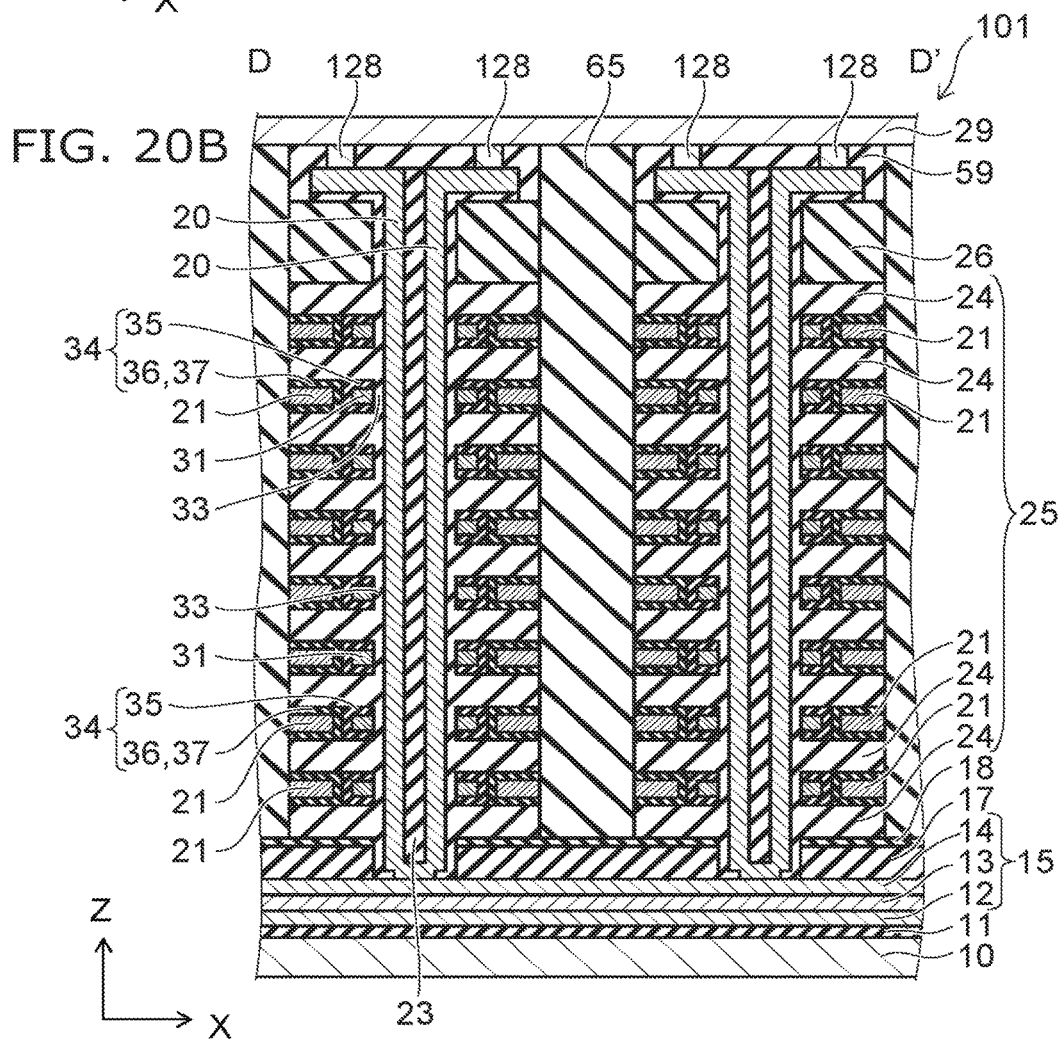
FIG. 20B is a cross-sectional view taken along the line D-D' shown in FIG. 20A.

FIG. 20A is a plan view illustrating a semiconductor memory device according to the comparative example, and FIG. 20B is a cross-sectional view taken along the line D-D' shown in FIG. 20A.

As shown in FIGS. 20A and 20B, in the semiconductor memory device 101 according to the comparative example, the connection member 27 (refer to FIG. 2B) is not provided, and the silicon pillars 20 are extracted to a portion above the upper surface of the hard mask 26. One contact 128 is connected to an extracted portion of one silicon pillar 20. For this reason, the contacts 128 are arranged in a matrix along the X-direction and the Y-direction as viewed from the Z-direction. The arrangement pitch of the contacts 128 in the Y-direction is equal to the arrangement pitch of the bit lines 29.

In the comparative example, when the arrangement pitch of the bit lines 29 is reduced for improving the density of memory cell transistors, the arrangement pitch of the contacts 128 is also reduced. Accordingly, a lithography margin and a processing margin are reduced. As a result, the difficulty of forming the contacts 128 is increased. Moreover, since the diameter of each of the contacts 128 is reduced, the resistance of the contact 128 is increased.

According to the embodiment described above, a semiconductor memory device having high density can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a first semiconductor pillar extending in a first direction;
a second semiconductor pillar extending in the first direction, the first semiconductor pillar and the second semiconductor pillar being arranged in a second direction intersecting the first direction;
a first electrode film extending in a third direction intersecting the first direction and the second direction;
a second electrode film extending in the third direction, the first electrode film and the second electrode film being arranged in the second direction;
a first memory portion provided between the first semiconductor pillar and the first electrode film;
a second memory portion provided between the second semiconductor pillar and the second electrode film;
a first connection member being electrically connected in common to an upper portion of the first semiconductor pillar and an upper portion of the second semiconductor pillar;
a first contact, a lower portion of the first contact being electrically connected to the first connection member; and
a first upper interconnect extending in the second direction and electrically connected to an upper portion of the first contact,
the first electrode film and the second electrode film not being disposed between the first semiconductor pillar and the second semiconductor pillar.

2. The device according to claim 1, wherein
the first semiconductor pillar and the second semiconductor pillar are disposed between the first electrode film and the second electrode film.

3. The device according to claim 1, further comprising:
a conductive layer containing silicon, the conductive layer being electrically connected in common to a lower portion of the first semiconductor pillar and a lower portion of the second semiconductor pillar.

4. The device according to claim 1, wherein
the first semiconductor pillar and the second semiconductor pillar are directly connected to a first insulating layer.

5. The device according to claim 1, further comprising:
a third semiconductor pillar extending in the first direction, the first semiconductor pillar and the third semiconductor pillar being arranged in the third direction;
a fourth semiconductor pillar extending in the first direction, the second semiconductor pillar and the fourth semiconductor pillar being arranged in the third direction, the third semiconductor pillar and the fourth semiconductor pillar being arranged in the second direction;
a third memory portion provided between the third semiconductor pillar and the first electrode film;
a fourth memory portion provided between the fourth semiconductor pillar and the second electrode film;
a second connection member being connected in common to an upper portion of the third semiconductor pillar and an upper portion of the fourth semiconductor pillar;
a second contact, a lower portion of the second contact being connected to the second connection member; and
a second upper interconnect extending in the second direction and connected to an upper portion of the second contact.

6. The device according to claim 4, further comprising:
a conductive layer containing silicon, the conductive layer being electrically connected in common to a lower portion of the first semiconductor pillar, a lower portion of the second semiconductor pillar, a lower portion of the third semiconductor pillar and a lower portion of the fourth semiconductor pillar.

7. The device according to claim 5, wherein
the third semiconductor pillar and the fourth semiconductor pillar are directly connected to a second insulating layer.

8. The device according to claim 1, wherein
the first memory portion includes:
a first charge storage portion provided between the first semiconductor pillar and the first electrode film;
a first insulating film provided between the first semiconductor pillar and the first charge storage portion; and
a second insulating film provided between the first charge storage portion and the first electrode film,
the second memory portion includes:
a second charge storage portion provided between the second semiconductor pillar and the second electrode film;
a third insulating film provided between the second semiconductor pillar and the second charge storage portion; and
a fourth insulating film provided between the second charge storage portion and the second electrode film.

9. The device according to claim 1, wherein
the first connection member contains silicon.

10. The device according to claim 1, wherein
a lower portion of the first semiconductor pillar and a lower portion of the second semiconductor pillar are integrated together.

11. A semiconductor memory device comprising:
a first memory string extending in a first direction away from a substrate, the first memory string having a first selection transistor and a first memory cell transistor;
a second memory string extending in the first direction, the second memory string having a second selection transistor and a second memory cell transistor, the first memory string and the second memory string being arranged in a second direction intersecting the first direction;

a first connection member being connected in common to a first end of the first memory string and a first end of the second memory string a first contact, a first portion of the first contact being connected to the first connection electrode member; and a first interconnect extending in the second direction and connected to a second portion of the first contact.

12. The device according to claim 11, further comprising:

a third memory string extending in the first direction, the third memory string having a third selection transistor and a third memory cell transistor;

a fourth memory string extending in the first direction, the fourth memory string having a fourth selection transistor and a fourth memory cell transistor, the third memory string and the fourth memory string being arranged in the second direction, a second connection member being connected in common to a first end of the third memory string and a first end of the fourth memory string, a second contact, a first portion of the second contact being connected to the second connection member; and a second upper interconnect extending in the second direction and connected to a second portion of the second contact, a position of the first contact and a position of the second contact being different from each other in the second direction.

13. The device according to claim 12, wherein a gate of the first memory cell transistor and a gate of the fourth memory cell transistor are electrically shared, a gate of the second memory cell transistor and a gate of the third memory cell transistor are electrically shared.

14. The device according to claim 13, wherein the first memory string and the fourth memory string are arranged in the third direction, and the second memory string and the third memory string are arranged in the third direction.

15. The device according to claim 11, wherein a second end of the first memory string and a second end of the second memory string are electrically connected to each other.

16. The device according to claim 11, further comprising:

a conductive layer containing silicon, the conductive layer being electrically connected in common to a second end of the first memory string and a second end of the second memory string.

17. The device according to claim 11, wherein the first connection member contains silicon.

* * * * *